United States Patent [19]

Wengler et al.

[11] 4,230,901
[45] Oct. 28, 1980

[54] HOUSING FOR SEMICONDUCTOR DEVICE

[75] Inventors: Christian Wengler; Herbert Vogt, both of Munich, Fed. Rep. of Germany

[73] Assignee: Siemens Aktiengesellschaft, Berlin and Munich, Fed. Rep. of Germany

[21] Appl. No.: 35,271

[22] Filed: May 1, 1979

[30] Foreign Application Priority Data

May 3, 1978 [DE] Fed. Rep. of Germany ....... 2819499

[51] Int. Cl.$^3$ ............................................. H05K 7/20
[52] U.S. Cl. .............................. 174/52 PE; 361/386; 29/841
[58] Field of Search ............ 29/588, 627; 174/16 HS, 174/52 PE, 52 S; 357/80, 81; 361/381, 386–389

[56] References Cited

U.S. PATENT DOCUMENTS

| | | | |
|---|---|---|---|
| 3,622,419 | 11/1971 | London et al. ................. | 174/52 PE |
| 3,848,077 | 11/1974 | Whitman ........................ | 29/627 |
| 3,906,144 | 9/1975 | Wiley ............................. | 174/52 S |
| 3,911,327 | 10/1975 | Murarl et al. .................. | 174/16 HS |

*Primary Examiner*—Gerald P. Tolin
*Attorney, Agent, or Firm*—Herbert L. Lerner

[57] ABSTRACT

Housing for a semiconductor device includes a housing cup in which the semiconductor device is disposed, the housing cup has a bottom, at least one wall and a metal plate disposed opposite the bottom. The metal plate is thermally connected to the semiconductor device and has a mounting surface connectible to a heat sink and a lateral surface perpendicular to the mounting surface. Contacts extend from inside the housing cup through the bottom and are firmly connected thereto. Cutouts are formed in the metal plate at the edges thereof opposite said contacts. The mounting surface of the metal plate extends beyond the wall opposite the bottom. The housing is fillable with sealing compound through the cutouts to an extent where at least part of the lateral surface of the metal plate is wetted with sealing compound.

5 Claims, 3 Drawing Figures

HOUSING FOR SEMICONDUCTOR DEVICE

The present invention relates to a housing for a semiconductor device, wherein the semiconductor device or components are disposed in a housing cup which has a bottom and at least one wall and is filled with sealing compound. The semiconductor device is thermally connected to a metal plate which is disposed opposite the bottom of the housing cup. The metal plate has a mounting surface intended for connection to a heat sink, and lateral surfaces. The housing also has contacts going through the bottom of the housing cup.

Such a housing has already been basically described in the prior art. The semiconductor device which is to be accommodated in this housing has, on a first level, a printed circuit with an input circuit and a control circuit. A second level is formed by the metal plate which is in thermal contact with one or several semiconductor components. The outside of the metal plate forms a mounting surface intended for connection to a heat sink. The printed circuit has terminals for the input circuit and a load circuit, which are pushed through openings provided in the housing cup when assembled. The housing is filled with sealing compound.

It is not described in the prior art how the cup is filled with the sealing compound. It can be filled through openings which are provided either in the housing cup or in the metal plate. The metal plate can be connected to the cup by the sealing compound if the lateral surfaces of the metal plate are wetted by the sealing compound. This necessitates filling through an opening provided in the metal plate. If, however, too much sealing compound is added, it can spill over onto the mounting surface or form a hill which protrudes over the mounting surface in the area of the opening. This hill must then be removed prior to installation. In the known housing there is the further danger than the sealing compound could run out through the openings in the housing cup. It is accordingly an object of the invention to provide a housing for a semiconductor device which overcomes the hereinaforementioned disadvantages of the heretofore known devices of this general type and in which on the one hand, the sealing compound is prevented from running out through openings in the housing cup and in which on the other hand, it is impossible for the sealing compound to rise above the mounting surface.

With the foregoing and other objects in view, there is provided, in accordance with the invention, a housing for a semiconductor device, comprising a housing cup in which the semiconductor device is disposed, the housing cup having a bottom, a wall and a metal plate disposed opposite the bottom, the metal plate being thermally connected to the semiconductor device and having a mounting surface connectible to a heat sink and a lateral surface perpendicular to the mounting surface, contacts extending from inside the housing cup through the bottom and being firmly connected thereto, and cutouts formed in the metal plate at the edges thereof opposite the contacts, the mounting surface of the metal plate extending beyond the wall opposite the bottom, the housing being fillable with sealing compound through the cutouts to an extent where at least part of the lateral surface of the metal plate is wetted with sealing compound.

In accordance with another feature of the invention, there are provided projections integral with the inside of the wall, the metal plate being supported on the projections.

In accordance with a further feature of the invention, the metal plate is so dimensioned that only the lateral surface thereof at said cutouts are wetted with sealing compound.

In accordance with an additional feature of the invention, the contacts are pressed-in to the bottom.

In accordance with a concomitant feature of the invention, the metal plate is smaller than the inside dimension of the wall so as to leave a space between the lateral edges and the inside of the wall.

Other features which are considered as characteristic for the invention are set forth in the appended claims.

Although the invention is illustrated and described herein as embodied in housing for semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing, in which.

Figure 1:
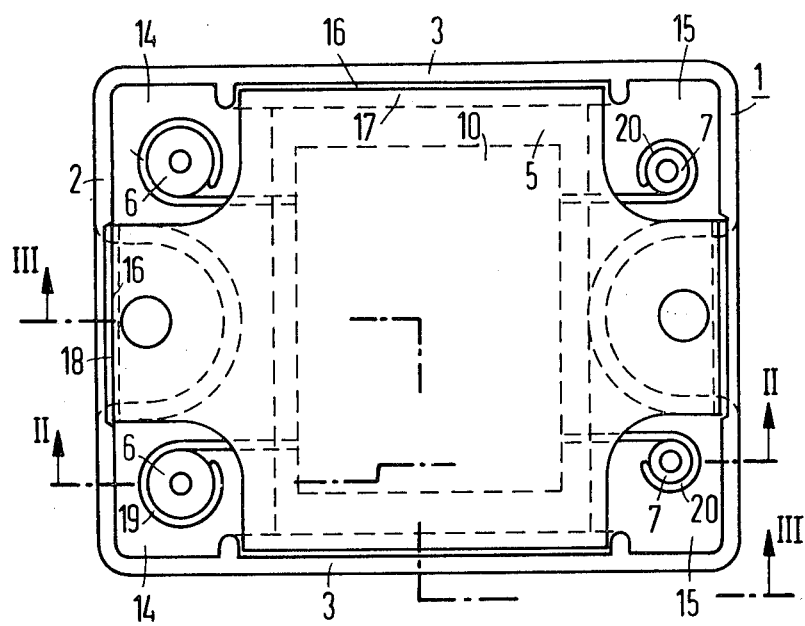
FIG. 1 is a top plan view onto a housing in accordance with the invention.
Figure 2:
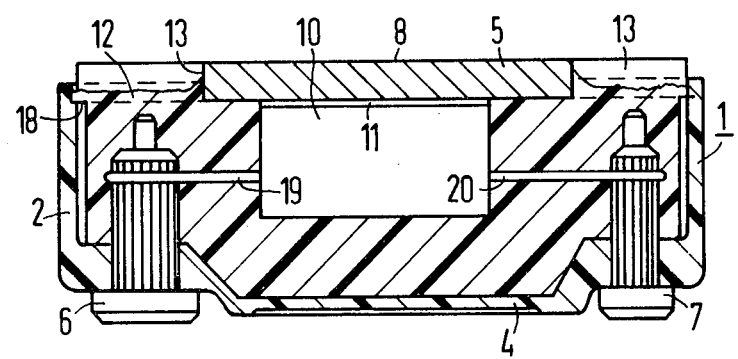
FIG. 2 is a cross-sectional view of the housing of FIG. 1 taken along the line II—II in the direction of the arrows.
Figure 3:
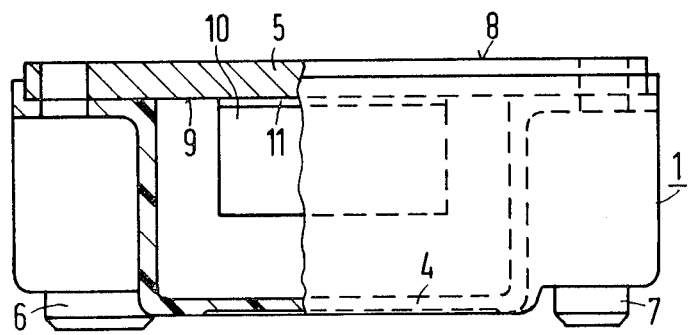
FIG. 3 is a partially cross-sectional and partially elevational view of the housing of FIG. 1 taken along the line III—III in the direction of the arrows.

Referring now particularly to the three figures of the drawing, there is seen a housing cup which is generally designated with reference numeral 1 and has traverse walls 2, lengthwise walls 3 and a bottom 4. The housing cup 1 may be formed of plastic or another insulating material. The housing cup 1 is closed off by a metal plate 5, which is placed on the side of the housing cup 1 opposite the bottom 4. The metal plate 5 has a mounting surface 8 to be used for connection to a heat sink, a surface 9 opposite the surface 8, and lateral surfaces 13. A semiconductor device 10 is connected to the surface 9 in a thermally conducting manner. If electrical insulation is desired between the semiconductor device 10 and the metal plate 5, then a highly thermally conducting insulating layer 11, formed for instance of aluminum oxide or beryllium oxide, is disposed between the parts 5 and 10. The parts 5, 10 and 11 can be cemented together, for instance. Contacts 6, 7 are mounted in the bottom 4 of the housing cup 1. These contacts are pressed-in so that the sealing compound filled into the housing cup cannot run out. However, the contacts 6, 7 can also be connected to the housing cup 1 by injection molding. The semiconductor device 10 is electrically connected to the contacts 6, 7 through leads 19, 20. The leads 20 may be, for instance, control lines for an electronic relay and the lines 19, the connecting lines for the load circuit to be switched.

When assembling the housing, the metal plate 5 with the semiconductor device 10 fastened thereto is placed on the housing cup 1. In this process, the leads 19 and 20 which are hook-shaped at their ends, slide over the contacts 6, 7. The leads 19, 20 are soldered to the contacts 6, 7 through cutouts 14, 15 provided in the metal plate 5. Thereupon, the housing cup 1 is filled through the cutouts 14, 15 with enough sealing compound 12 so that at least part of the lateral surface 13 of the metal plate 5 is wetted by the sealing compound 12. The metal plate 5 is thereby fastened to the housing cup 1.

In order to reliably prevent the level of the sealing compound 12 from rising up to the mounting surface 8 and to prevent the plastic of the sealing compound 12 from wetting the latter, the mounting surface 8 extends beyond the walls 2, 3 in the direction perpendicular or opposite to the bottom 4. For this purpose, the walls 2, 3 are provided on the inside with projections 17, 18, on which the lower surface 9 of the metal plate 5 rests. It is particularly advantageous if there is a small spacing between the edge 16 of the metal plate 5 and the insides of the walls 2, 3. During the casting, the sealing compound 12 can then wet the lateral surfaces 13 along the entire length of the edge 16. A particularly good fixation of the metal plate 5 is thereby achieved. Excess sealing compound can then flow off over the top of the walls 2, 3 without wetting the mounting surface 8.

The cutouts 14, 15 are located at the edge 16 of the metal plate 5. Thus, large excess amounts of sealing compound preferably flow over the walls 2, 3 in the region of the cutouts 14, 15. In addition, the formation of bumps in the vicinity of the cutouts above the level of the mounting surface 8 is prevented.

There are claimed:

1. Housing for a semiconductor device, comprising a housing cup in which the semiconductor device is disposed, said housing cup having a bottom, a wall and a metal plate disposed opposite said bottom, said metal plate being thermally connected to the semiconductor device and having a mounting surface connectible to a heat sink and a lateral surface perpendicular to said mounting surface, contacts extending from inside said housing cup through said bottom and being firmly connected thereto, and cutouts formed in said metal plate at the edges thereof opposite said contacts, said mounting surface of said metal plate extending beyond said wall opposite said bottom, said housing being filled with sealing compound through said cutouts to an extent where at least part of said lateral surface of said metal plate is wetted with sealing compound.

2. Housing according to claim 1, including projections integral with the inside of said wall, said metal plate being supported on said projections.

3. Housing according to claim 1, wherein said metal plate is so dimensioned that only the lateral surface thereof at said cutouts are wetted with sealing compound.

4. Housing according to claim 1, wherein said contacts are pressed-in to said bottom.

5. Housing according to claim 1, 2, 3 or 4, wherein said metal plate is smaller than the inside dimension of said wall so as to leave a space between said lateral edges and the inside of said wall.

* * * * *